United States Patent [19]
Suzuki

[11] Patent Number: 6,118,262
[45] Date of Patent: Sep. 12, 2000

[54] VOLTAGE GENERATING CIRCUIT AND D/A CONVERTER

[75] Inventor: Hisao Suzuki, Kasugai, Japan

[73] Assignee: Fujitsu Limited, Kawasaki, Japan

[21] Appl. No.: 09/458,803

[22] Filed: Dec. 10, 1999

[30] Foreign Application Priority Data

May 13, 1999 [JP] Japan ................................. 11-132643

[51] Int. Cl.$^7$ ................................ G05F 3/16; H03M 1/66
[52] U.S. Cl. ........................................... 323/313; 341/144
[58] Field of Search .................................. 323/313, 314, 323/315; 341/144, 146, 153

[56] References Cited

U.S. PATENT DOCUMENTS

| | | | |
|---|---|---|---|
| 3,997,892 | 12/1976 | Susset | 340/347 DA |
| 4,638,303 | 1/1987 | Masuda et al. | 340/347 DA |
| 5,283,579 | 2/1994 | Tasdighi et al. | 341/145 |
| 5,745,065 | 4/1998 | Wu | 341/144 |
| 5,952,948 | 9/1999 | Proebsting | 341/144 |

*Primary Examiner*—Matthew Nguyen
*Attorney, Agent, or Firm*—Armstrong, Westerman, Hattori, McCleland & Naughton

[57] ABSTRACT

A voltage dividing circuit accounts for resistance caused by switching elements and wires in order to provide accurate digital to analog conversion. The voltage dividing circuit includes a first voltage dividing circuit that divides a voltage between first and second reference power supply voltages and generates an output signal having a divided voltage. The first voltage dividing circuit includes first, second, and third impedance elements connected in series between the first and second reference power supplies. The first and second impedance elements are connected to the first and second power supplies, respectively, and the third impedance element is connected between the first and second impedance elements. A first current source is connected to a first node between the first and third impedance elements and a second current source is connected to a second node between the second and third impedance element. The first and second current sources provide first and second control currents, respectively, which maintain the potential difference between the first and second nodes substantially constant.

19 Claims, 7 Drawing Sheets

VOLTAGE GENERATING CIRCUIT AND D/A CONVERTER

BACKGROUND OF THE INVENTION

The present invention relates to a voltage generating circuit, and more particularly to a voltage generating circuit which divides a potential difference between a high potential power supply and a low potential power supply to generate a divided voltage and is used in a digital-to-analog (D/A) converter.

Semiconductor devices often have circuits, such as a D/A converter and a current generating circuit fabricated on a single semiconductor substrate. The D/A converter should improve the precision of linearity of its analog output signal.

FIG. 1 is a circuit diagram of a D/A converter 11 of a resistance string system mounted on a semiconductor device.

The D/A converter 11 divides a potential difference between a high potential power supply VDD and a low potential power supply VSS into 16 uniform portions and generates an analog signal Aout having a potential ((VDD−VSS)×(n/16)+VSS) corresponding to the digital signal D2-D0. The D/A converter 11 includes a voltage dividing circuit 12 having resistors R1 to R8, where the number corresponds to the three bit digital signal D2 to D0, switches SW1 to SW6, and inverter circuits 13 to 15. The resistors R1 to R8 are connected in series between the high potential power supply VDD and the low potential power supply VSS. The value of each resistor R1 to R8 is weighted in accordance with the bit number (in this case, three bits) of the digital signal D2 to D0.

When the resistor R1 has a reference value "1", then the resistors R2 and R7 have a value of "1", the resistors R3, R6 "2", and the resistors R4, R5, R8 have a value of "4". The value of each resistor R1 to R8 is weighted by connecting a predetermined number of resistor elements in parallel each having the identical value. That is, the resistors R4, R5, R8 are each formed with single resistor element, the resistors R1, R2, R7 are each formed with four resistor elements having the same value as that of the resistors R4, R5, R8, by connecting them in parallel, and the resistors R3 and R6 are each formed with two resistor elements connected in parallel.

The resistors R2 and R3 provided near the high potential power supply VDD are connected in parallel with the switches SW3 and SW4, respectively, while the resistors R6 and R7 provided near the low potential power supply VSS are connected in parallel with the switches SWS and SW6, respectively. Each of the switches SW3 and SW4 is formed of a P-channel MOS transistor and each of the switches SW5 and SW6 is formed of an N-channel MOS transistor. Each of the switches SW3 and SW6 is supplied at its gate with an inverted digital signal D0 inverted by the inverter circuit 15, and each of the switches SW4 and SW5 is supplied at its gate with an inverted digital signal D1 inverted by the inverter circuit 14. In this way, the switches SW3 to SW6 are turned on or off in accordance with the lower 2-bits of the digital signal.

For example, if the lower 2-bits of the digital signal D1, D0 have a status of "00", then the switches SW3 and SW4 are turned off while the switches SW5 and SW6 are turned on. Thus, the resistor value between the node N2 and the low potential power supply VSS is set to "4" while the resistor value between the high potential power supply VDD and the node N1 is set to "8". If the lower 2-bits D1, D0 have a status of "01", then the switches SW4 and SW6 are turned off while the switches SW3 and SW5 are turned on. Thus, the resistor value between the node N2 and the low potential power supply VSS is set to "5" while the resistor value between the high potential power supply VDD and the node N1 is set to "7".

The resistor value between the node N1 and the node N2 is always set to "4" (the resistor value of the resistor R5). Thus, the arrangement of the D/A converter 11 controls the switches SW3 to SW6 so that the resistor value between the high potential power supply VDD and the low potential power supply VSS is always maintained to have a constant value, "16". The D/A converter 11 changes successively the resister value between the high potential power supply VDD and the node N1 and the resistor value between the node N2 and the low potential power supply VSS in accordance with the lower 2-bits of the digital signal D1, D0.

The potentials of the nodes N1 and N2 are determined by the potential difference between the high potential power supply VDD and the low potential power supply VSS, the resistor value between the high potential power supply VDD and the node N1, the resistor value between the nodes N1 and N2, and the resistor value between the node N2 and the low potential power supply VSS. Thus, the D/A converter 11 changes the potentials at the nodes N1 and N2 by a step of one-sixteenth potential difference between the high potential power supply VDD and the low potential power supply VSS in accordance with the lower 2-bits of the digital signal D1, D0.

The D/A converter 11 turns one of the switches SW1 and SW2 on in accordance with the higher bit digital signal D2. When one of the switches SW1 and SW2 is turned on, a divided voltage corresponding to the turned on switch is provided from the D/A converter 11 as an analog signal Aout.

However, even if each of the switches SW3 to SW6 is turned on, turned-on switch status does not become a conductor having no resistor value or 0 ohm (Ω). Therefore, it follows that the resistor value of the turned-on switch SW1a to SW3b is connected in parallel with the resistor R2, R3, R6, R7. Furthermore, the switches SW3 to SW6 are connected to the resistors R2, P3, R6, R7 by way of conductive wires and hence the resistor component of the wire must be counted as a resistor value of the circuit. As a result, an error is caused in the resistor value between the node N1 and the high potential power supply VDD and the resistor value between the node N2 and the low potential power supply VSS, leading to a variation in the potential difference between the node N1 and the node N2. Due to this variation of the potential difference, the voltage between the high potential power supply VDD and the low potential power supply VSS is not accurately divided into 16 portions. This results in a deterioration of the accuracy of conversion from the digital signal D2 to D0 to the analog signal Aout.

SUMMARY OF THE INVENTION

An object of the present invention is to provide a voltage generating circuit that generates an analog signal with high precision.

In one aspect of the present invention, A voltage generating circuit is provided that includes a first voltage dividing circuit for dividing a voltage between a first reference power supply and a second reference power supply and generating an output signal having a divided voltage. The first voltage dividing circuit includes a first impedance element connected to a first terminal to which the first reference power supply is provided, a second impedance element having an impedance substantially the same as that of the first impedance element and connected to a second terminal to which the second reference power supply is provided, and a third impedance element connected between the first impedance element and the second impedance element and having a predetermined impedance. A first current source is connected to a first node provided between the first impedance element and the third impedance element. A second current source is connected to a second node provided between the second impedance element and the third impedance element. The first current source and the second current source supply a first control current and a second control current, which are related to each other, to the first node and the second node, respectively, and change the potentials of the first node and the second node to potentials corresponding to the first control current and the second control current, respectively, while the potential difference between the first node and the second node is maintained constant.

In another aspect of the present invention, a voltage generating circuit is provided that includes a first voltage dividing circuit for dividing a voltage between a first reference power supply and a second reference power supply and generating an output signal having a divided voltage. The first voltage dividing circuit includes a first impedance element connected to a first terminal to which a voltage of the first reference power supply is supplied, a second impedance element having an impedance substantially the same as that of the first impedance element and connected to a second terminal to which a voltage of the second reference power supply is supplied, and a third impedance element connected between the first impedance element and the second impedance element and having a predetermined impedance. A first current source is connected to a first node provided between the first impedance element and the third impedance element. A second current source is connected to a second node provided between the second impedance element and the third impedance element. The first current source and the second current source supply a first control current and a second control current having an interrelation with each other, to the first node and the second node, respectively, and change the potentials of the first node and the second node to potentials corresponding to the first control current and the second control current, respectively, while the potential difference between the first node and the second node is maintained substantially constant. A constant-current circuit is connected to the first and second current sources for generating a unit current. The first and second current sources change the first and second control currents, respectively, based on the unit current. A voltage correcting circuit is connected to at least one of the first and second nodes and supplies a predetermined set current to at least one of the first and second nodes. A first current correcting circuit is connected to the first terminal and receives from the first terminal a first correcting current having a magnitude substantially the same as that of the second control current. A second current correcting circuit is connected to the second terminal and supplies to the second terminal a second correcting current having a magnitude substantially the same as that of the first control current.

In yet another aspect of the present invention, a D/A converter is provided that converts a digital signal containing an upper bit and lower bits to an analog signal. The D/A converter includes a voltage generating circuit for generating a plurality of output voltage signals corresponding to the number of the lower bits of the digital signal. A selecting circuit selects one of the plurality of output voltage signals in accordance with the upper bit of the digital signal and outputs the selected output voltage signal as an analog signal. The voltage generating circuit includes a first voltage dividing circuit for dividing a voltage between a first reference power supply and a second reference power supply and generating the plurality of output voltage signals having a divided voltage. The first voltage dividing circuit includes a first impedance element connected to a first terminal to which a voltage of the first reference power supply is supplied, a second impedance element having an impedance substantially the same as that of the first impedance element and connected to a second terminal to which a voltage of the second reference power supply is provided, and a third impedance element connected between the first impedance element and the second impedance element and having a predetermined impedance. A first current source is connected to a first node provided between the first impedance element and the third impedance element. A second current source is connected to a second node provided between the second impedance element and the third impedance element. The first current source and the second current source supply a first control current and a second control current, which are related to each other, to the first node and the second node, respectively, and change the potentials of the first node and the second node to potentials corresponding to the first control current and the second control current, respectively, while the potential difference between the first node and the second node is maintained constant.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiment together with the accompanying drawings in which.

DETAILED DESCRIPTION OF THE PREFERRED EMBODIMENTS

Figure 1:
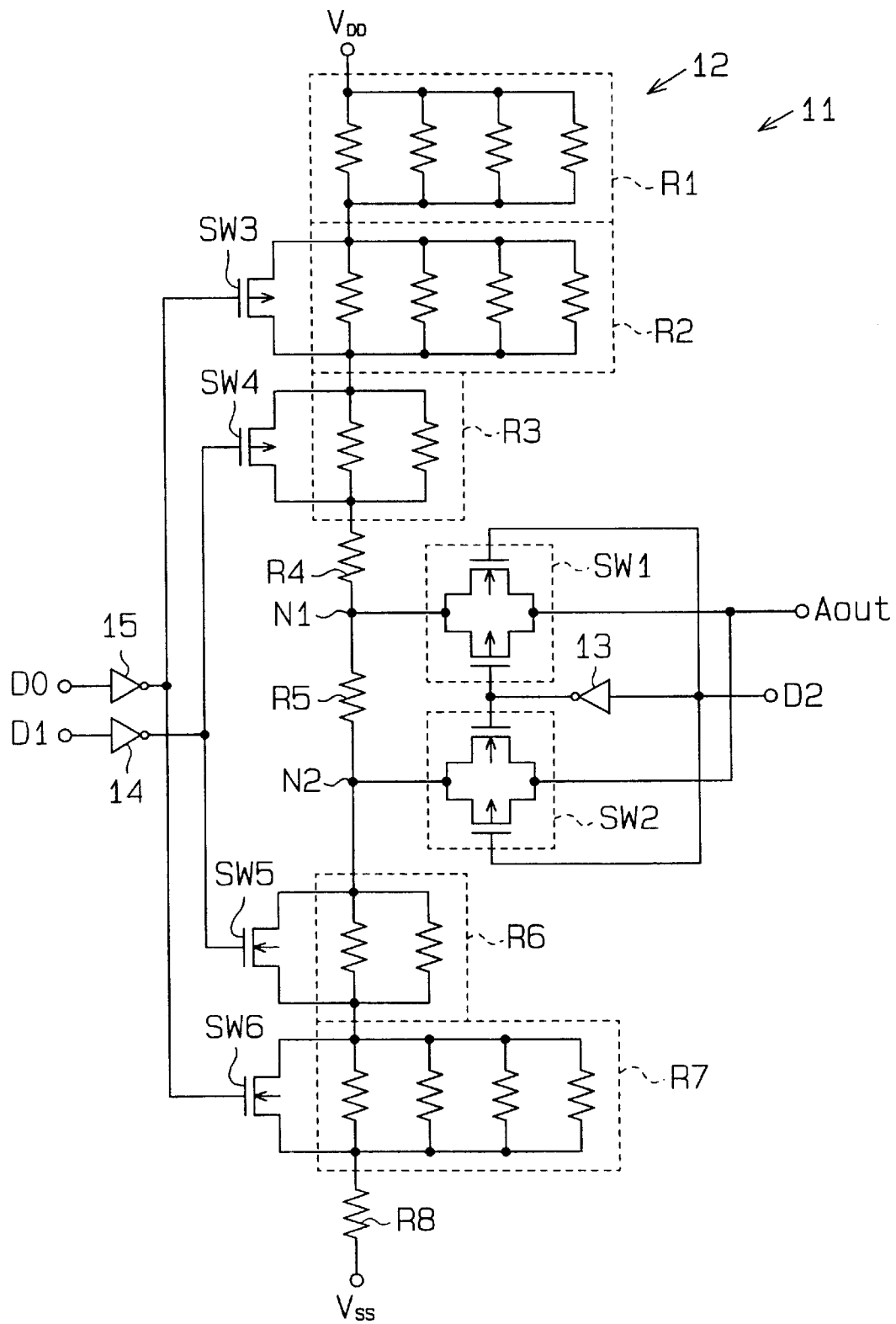
FIG. 1 is a circuit diagram of a conventional D/A converter.
Figure 2:
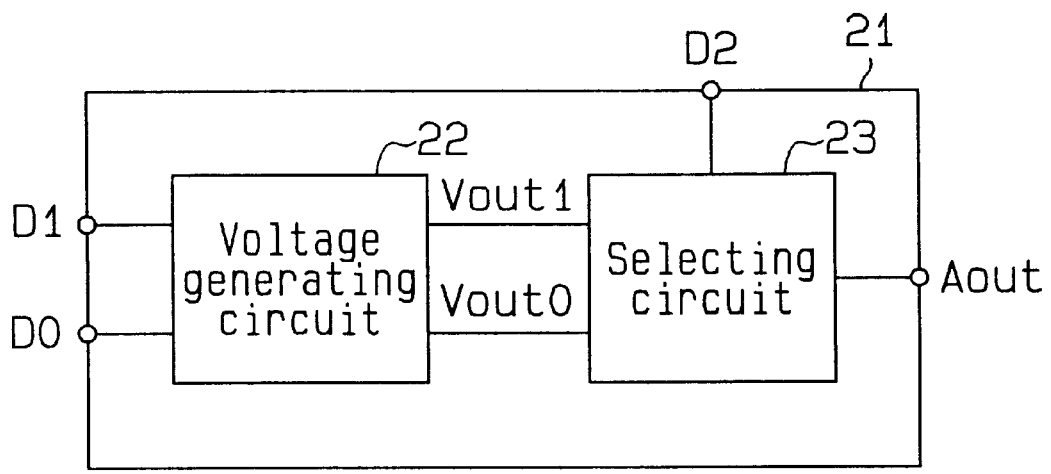
FIG. 2 is a schematic block diagram of a D/A converter according to one embodiment of the present invention.

FIG. 2 is a schematic block diagram of a D/A converter 21 according to one embodiment of the present invention.

The D/A converter 21 generates an analog signal Aout having a potential corresponding to a digital signal D2 to D0 (in this case, three bits). The D/A converter 21 includes a voltage generating circuit 22 and an output voltage selecting circuit 23.

The voltage generating circuit 22 includes a resistor string, and supplies a plurality of (in this case, two) output signals Vout0 and Vout1 corresponding to the lower bits D1, D0 to the selecting circuit 23. The voltage generating circuit 22 further changes the potentials of the output signals Vout0 and Vout1 by a predetermined amount in response to the lower 2-bits of the digital signal D1, D0 while maintaining the potential difference between the output signals Vout0 and Vout1 constant.

The selecting circuit 23 selects one of the output signals Vout0 and Vout1 in response to the upper bit of the digital signal D2, and outputs the selected output signal as the analog signal Aout. The number of combinations of the status of the 2-bit digital signal D1, D0 is four. Therefore, the voltage generating circuit 22 can output the output signals Vout0, Vout1 with any of four potentials. Accordingly, the D/A converter 21 can generate the analog signal Aout with any of eight values.

Figure 3:
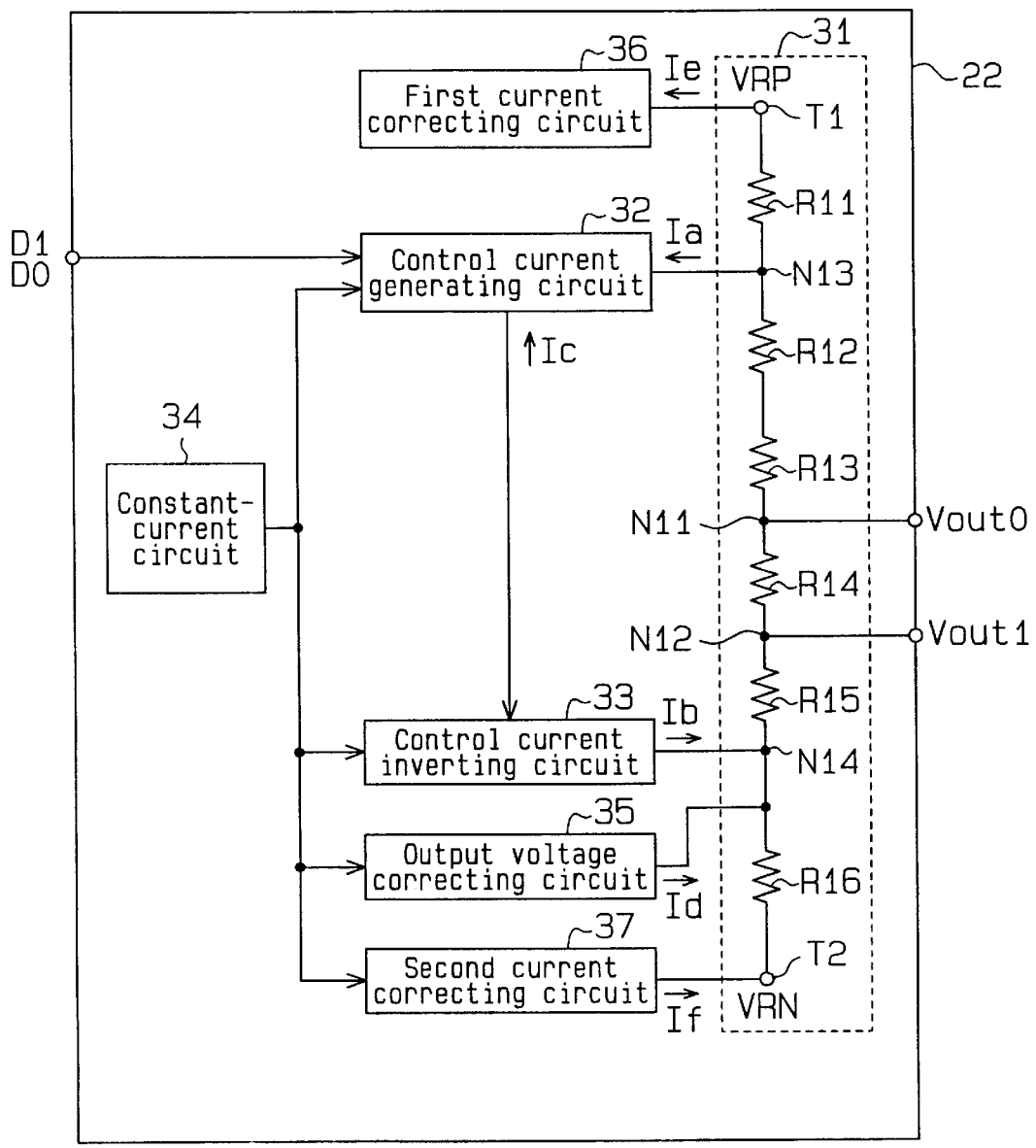
FIG. 3 is a schematic block diagram of a voltage generating circuit of the D/A converter of FIG. 2.

FIG. 3 is a schematic block diagram of the voltage generating circuit 22.

The voltage generating circuit 22 includes a first voltage dividing circuit 31, an output voltage control current generating circuit 32, an output voltage control current inverting circuit 33, a constant-current circuit 34, an output voltage correcting circuit 35, a high voltage terminal current correcting circuit 36 and a low voltage terminal current correcting circuit 37.

The first voltage dividing circuit 31 includes a plurality of resistors R11 to R16 (in this case, six resistors) or impedance elements connected in series between a first terminal T1 and a second terminal T2. A first reference source VRP of a high potential is applied to the first terminal T1 and a second reference source VRN of a low potential is applied to the second terminal T2. The first resistor R11 connected to the first terminal T1 and the sixth resistor R16 connected to the second terminal T2 have substantially the same impedance. The second to fifth resistors R12 to R15 provided between the first resistor R11 and the sixth resistor R16 have substantially the same impedance as that of the first and sixth resistors R11, R16.

The first voltage dividing circuit 31 generates a divided voltage by dividing the potential difference between the first reference source VRP and the second reference source VRN at each of the nodes provided between the respective resistors R11 to R16. The first output signal Vout0 is supplied from a node N11 provided between the third resistor R13 and the fourth resistor R14 to the selecting circuit 23 and the second output signal Vout1 is supplied from a node N12 provided between the fourth resistor R14 and the fifth resistor R15 to the selecting circuit 23.

A node N13 provided between the first resistor R11 and the second resistor R12 is connected with the control current generating circuit 32 as a current source, and the node N14 provided between the fifth resistor R15 and sixth resistor R16 is connected with the control current inverting circuit 33 as a current source. The control current generating circuit 32 and the control current inverting circuit 33 supply a control current Ia and a control current Ib which are related with each other, to the node N13 and the node N14, respectively. The control current generating circuit 32 and the control current inverting circuit 33 also cause the control current Ia and the control current Ib flow in directions inverse to each other.

More specifically, the control current generating circuit 32 draws the first control current Ia from the node N13 and also draws a current Ic which is related with the first control current Ia from the control current inverting circuit 33. The control current generating circuit 32 controls the first control current Ia and the current Ic so that the sum of the absolute value of the first control current Ia and the absolute value of the current Ic is always maintained constant. The control current inverting circuit 33 supplies the second control current Ib which is related to the first control current Ia and flows in a direction opposite to that of the first control current Ia, to the node N14. It should be noted that although the first control current Ia flows from the node N13 to the control current generating circuit 32 and the second control current Ib flows from the control current inverting circuit 33 to the node N14, these currents may flow in directions inverse to those shown in FIG. 3, respectively.

The first control current Ia only flows through the first resistor R11 and the second control current Ib only flows through the sixth resistor R16. Therefore, the control current generating circuit 32 and the control current inverting circuit 33 can control the first control current Ia and the second control current Ib, respectively, so as to control effective impedance values of the first resistor R11 and the sixth resistor R16, respectively.

The control current generating circuit 32 maintains the sum of the absolute values of the control current Ia and the control current Ib constant. Thus, the value of the current flowing between the first terminal T1 and the second terminal T2 is maintained constant regardless of any change of the values of the control currents Ia and Ib. That is, the control current generating circuit 32 and the control current inverting circuit 33 control the potentials at the node N13 and the node N14 while maintaining the potential difference of the node N13 and the node N14 (i.e., potential difference between the node N11 and the node N12).

The constant-current circuit 34 is connected to the control current generating circuit 32 and the control current inverting circuit 33, and generates a unit current in accordance with the step for changing the potentials of the output signals Vout0 and Vout1. The value of the unit current is set in accordance with the step for changing the potentials of the output signals Vout0 and Vout1. That is, one step amount (changing amount) is derived by dividing uniformly the potential difference between the node N11 and the node N12 by the number of possible values, or four of the lower bit digital signal D1, D0. Therefore, the value of the unit current is determined such that the changing amount of one step becomes the potential difference between both the ends of the resistor (unit resistor) which is obtained by equally dividing the impedance between the node N11 and the node N12 by the number of values, four. If the magnitude of the control current Ia, Ib is incremented or decremented by the unit current, then it is possible to change the potential at the node N13, N14 (i.e., potential of the output signal Vout0, Vout1) at every step.

The control current generating circuit 32 and the control current inverting circuit 33 change the values of the control currents Ia, Ib to integer multiples of the unit current based on the digital signal D1, D0. More specifically, the control current generating circuit 32 draws the first control current Ia which has been decremented by a value ΔI, which is an integer multiple of the unit current, from the node N13 while the control current inverting circuit 33 supplies the second control current Ib which has been incremented by the value ΔI to the node N14.

The output voltage correcting circuit 35 supplies a setting current Id having an initial value to the node N14. The setting current Id flows in only the sixth resistor R16 and changes the effective impedance of the sixth resistor R16. In this way, the effective impedance between the first terminal T1 and the second terminal T2 is set to a predetermined value. According to the present embodiment, the effective impedance between the first terminal T1 and the second terminal T2 is set to thirty-six (36) times the unit resistance. Thus, the voltage generating circuit 22 generates the output signals Vout0 and Vout1 which change at a single step of voltage value obtained by dividing the potential difference between the first reference source VRP and the second reference source VRN by thirty-six (36). The effective impedance between the first terminal T1 and the second terminal T2 may be varied depending on necessity.

The first current correcting circuit 36 and the second current correcting circuit 37 are connected to the first terminal T1 and the second terminal T2, respectively, and supply correcting currents Ie and If corresponding to the control currents Ia and Ib respectively, to the first terminal T1 and the second terminal T2, respectively. The first current correcting circuit 36 and the second current correcting circuit 37 prevent the potentials of the first and second reference sources VRP, VRN from fluctuating due to the first and second control currents Ia and Ib.

More specifically, the first current correcting circuit 36 draws from the first terminal T1, the first correcting current Ie, which is substantially the same as the second control current Ib supplied to the node N14. The second control current Ib is related to the first control current Ia. Thus, the first current correcting circuit 36 draws the first correcting current Ie, which is related to the first control current Ia from the first terminal T1. In this way, the current amount between the first terminal T1 and the second terminal T2 is maintained constant, so that the potentials of the first terminal T1 and the second terminal T2 become stable.

The second current correcting circuit 37 supplies the second correcting current If substantially the same as the first control current Ia from the node N13, to the second terminal T2. In other words, the second current correcting circuit 37 supplies the second correcting current If, which is related to the second control current Ib to the second terminal T2. In this way, the current amount between the first terminal T1 and the second terminal T2 is maintained constant, so that the potentials of the first terminal T1 and the second terminal T2 become stable.

Now, the principle of the operation of the voltage generating circuit 22 will be described.

Figure 4:
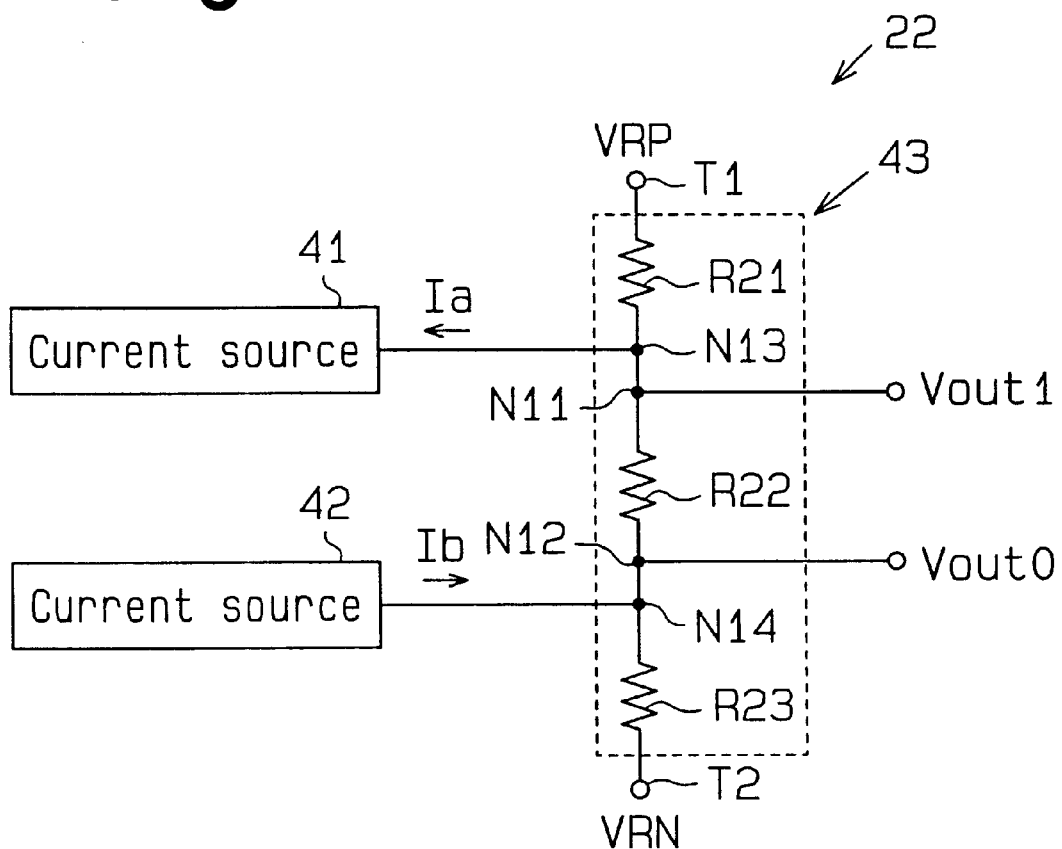
FIG. 4 is a schematic diagram for explaining the principle of the voltage generating circuit of FIG. 3.

FIG. 4 is a simplified block circuit diagram of the voltage generating circuit 22 to facilitate the operation principle of the voltage generating circuit 22. The voltage generating circuit 22 includes resistors R21, R22, R23 and first and second current sources 41, 42.

The resistors R21 to R23 are connected in series between the first terminal T1 and the second terminal T2 and form a voltage dividing circuit 43. The first reference source VPP of a high potential is applied to the first terminal T1 and the second reference source VRN of a low potential is applied to the second terminal T2. The first resistor R21 connected to the first terminal T1 and the third resistor R23 connected to the second terminal T2 have substantially the same impedance. The second resistor R22 has substantially the same impedance as those of the resistors R21 and R23. In this case, "R" is taken as the value of each of the resistors R21 to R23.

The first current source 41 is connected to the node N13 provided between the first resistor R21 and the second resistor R22, and draws the first control current Ia from the node N13. The second current source 42 is connected to the node N14 provided between the second resistor R22 and the third resistor R23, and supplies the second control current Ib, which is related to the first control current Ia to the node N14. The first output signal Vout0 is generated from the node N11 provided between the first resistor R21 and the second resistor R22. Also, the second output signal Vout1 is generated from the node N12 provided between the second resistor R22 and the third resistor R23.

Now, it is assumed that the value of the first reference source VRP is "V1" while the value of the second reference source VRN is "0V".

Initially, in order to obtain an initial voltage set value "8/16×V1" of the first output signal Vout0 and an initial voltage set value "4/16×V1" of the second output signal Vout1, the value of the first control current Ia (steady-state current value) from the first current source 41 is determined. The value of the current can be calculated by the following equation.

When the first current source 41 supplies the first control current Ia of zero ampere, the first output signal Vout0 is given as follows:

$$Vout0 = (2R/3R) \times V1 = 2/3 \times V1$$

Therefore, the voltage difference $\Delta V$ between the first output signal Vout0 and the target voltage value "8/16×V1" is given as follows:

$$\Delta V = 2/3 \times V1 - 8/16 \times V1 = 1/6 \times V1$$

The first control current Ia caused by the first current source 41 flows in only the first resistor R21. Therefore, a current value I(0) to be set for the first current source 41 is calculated as follows:

$$I(0) = \Delta V/R = (1/6 \times V1)/R$$

If the output signals Vout0 and Vout1 are incremented by one step (i.e., 1/16×V1), a current value I(t) of the unit current for the control current Ia, Ib becomes as follows:

$$|I(t)| = (1/16 \times V1)/R$$

Therefore, a value I(1) of the control current Ia of the first current source 41 upon changing the first output signal Vout0 from the initial voltage set value at every step can be calculated as follows:

$$I(1) = I(0) - I(t) \times D(n)$$
$$= (1/6 \times V1)/R - ((1/16 \times V1)/R) \times D(n)$$

Since the first and second current sources 41, 42 always maintain the sum of the absolute value of the control currents Ia, Ib a value I(2) of the control current Ib of the second current source 42 becomes as follows:

$$I(2) = I(t) \times D(n)$$
$$= ((1/16 \times V1)/R) \times D(n)$$

D(n) represents a decimal number of the digital signal D1, D0 and can take a value of from 0 to 3. Therefore, the set current values I(1), I(2) of the first and second control currents Ia, Ib for changing the first and second output signals Vout0, Vout1 at every step can be calculated as follows:

When Vout0=8/16×V1 and Vout1=4/16×V1,

I(1)=(1/6×V1)/R−((1/16×V1)/R)×0

I(2)=((1/16×V1)/R)×0

When Vout0=9/16×V1 and Vout1=5/16×V1,

I(1)=(1/6×V1)/R−((1/16×V1)/R)×1

I(2)=((1/16×V1)/R)×1

When Vout0=10/16×V1 and Vout1=6/16×V1,

I(1)=(1/6×V1)/R−((1/16×V1)/R)×2

I(2)=((1/16×V1)/R)×2

When Vout0=11/16×V1 and Vout1=7/16×V1,

I(1)=(1/6×V1)/R−((1/16×V1)/R)×3

I(2)=((1/16×V1)/R)×3

If the combination of the current values I(1), I(2) of the first and second control currents Ia, Ib and the first and second output signals Vout0, Vout1 is appropriately selected, eight patterns of voltage ranging from "4/16×V1" to "11/16×V1" can be obtained.

As described above, the first voltage dividing circuit 43 (i.e., resistor string) is composed of only a resistor element and does not have any switch and wire between the switch and the resistor element. Therefore, the voltage generating circuit 22 can produce a voltage equally divided at a high precision.

Figure 5:
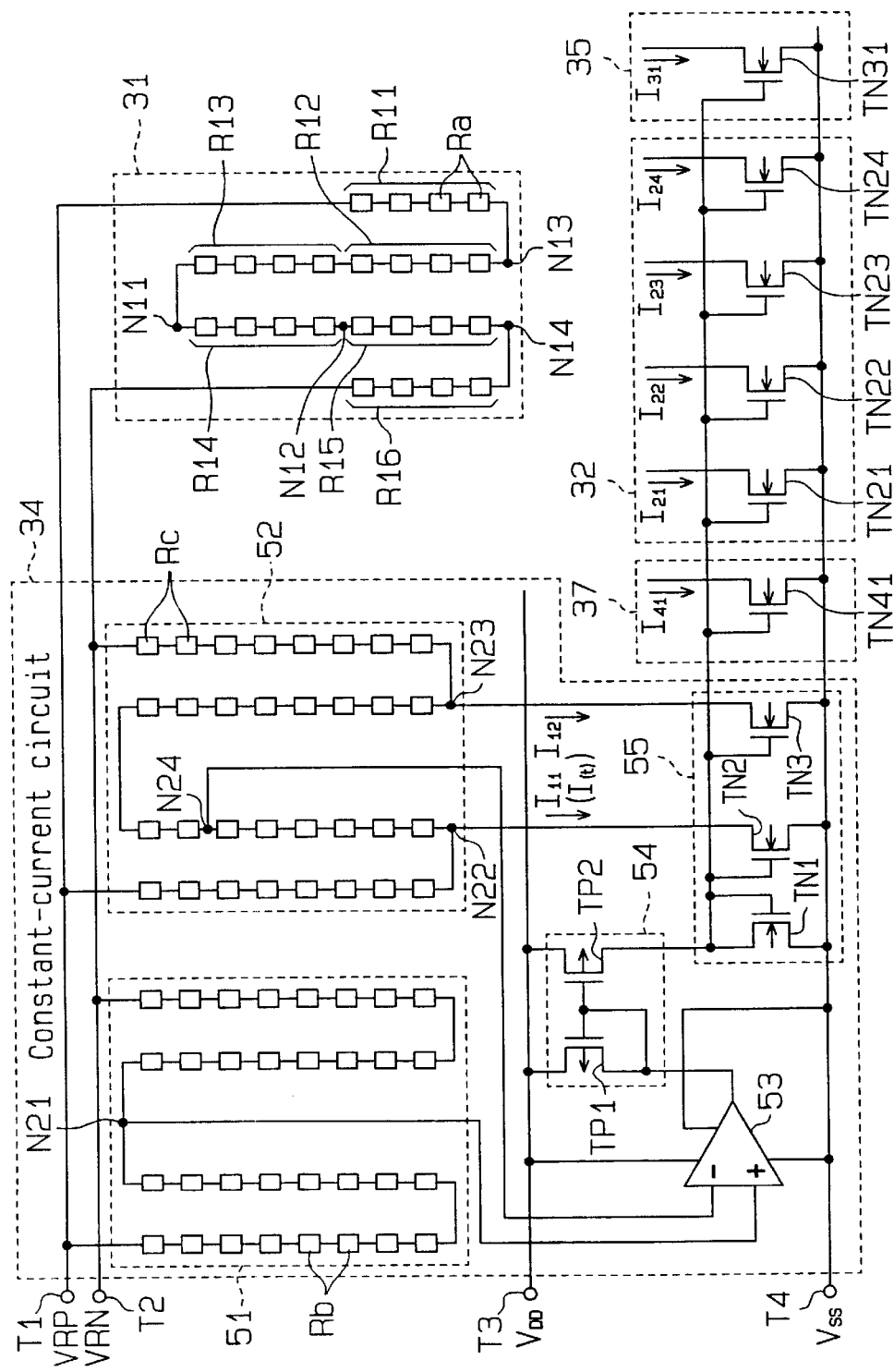
FIG. 5 is a circuit diagram of a voltage dividing circuit and a constant-current circuit of the voltage generating circuit of FIG. 3.

FIG. 5 is a circuit diagram of the first voltage dividing circuit 31 and the constant-current circuit 34.

Each of the resistors R11 to R16 of the first voltage dividing circuit 31 includes a plurality of (four) unit resistors Ra having substantially the same impedance. The constant-current source 34 includes second and third voltage dividing circuits 51, 52, an operational amplifier 53, and first and second current mirror circuits 54 and 55.

The second voltage dividing circuit 51 includes thirty-two (32) unit resistors Rb connected in series between the first terminal T1 and the second terminal T2. All of the resistor elements Rb have an impedance substantially the same as that of the unit resistor Ra forming the first voltage dividing circuit 31. Therefore, a node N21 provided between the sixteenth resistor Rb and the seventeenth resistor Rb, as counted from the first terminal T1, has a potential of ((VRP−VRN)/2) which is intermediate between the potentials of the first reference source VRP and the second reference source VRN.

The third voltage dividing circuit 52 includes thirty-two (32) unit resistor elements Rc connected in series between the first terminal T1 and the second terminal T2. All of the resistor elements Rc have an impedance substantially the same as that of the unit resistor Ra forming the first voltage dividing circuit 31. Therefore, a synthesized resistor value between a node N22 between the eighth and ninth resistors Rc, and the first terminal T1 has substantially the same as a synthesized resistor value between a node N23, which is between the twenty-fourth and twenty-fifth resistors Rc, and the second terminal T2.

A synthesized resistor value between a node N24, which is between the fourteenth and fifteenth resistors Rc, and the node N22 is smaller than the synthesized resistor value between the node N21 and the first terminal T1 by an amount of two resistors Pc (i.e., twice the unit resistor Ra) (14×Ra). A synthesized resistor value between the node N24 and the node N23 is larger than a synthesized resistor value between the node N21 and the second terminal T2 by an amount of two resistors Rc (18×Ra).

The operational amplifier 53 is connected at its plus input terminal to the node N21 of the second voltage dividing circuit 51 and at its minus input terminal to the node N24 of the third voltage dividing circuit 52. The operational amplifier 53 is connected at its output terminal to the first current mirror circuit 54.

The first current mirror circuit 54 is formed with a couple of P-channel MOS transistors TP1 and TP2. Sources of the transistors TP1 and TP2 are connected to a third terminal T3. A high potential power supply VDD higher than the potential of the first reference source VRP is applied to the third terminal T3. A drain of the first PMOS transistor TP1 provided on the input side of the first current mirror circuit 54 is connected to the output terminal of the operational amplifier 53. A drain of the second PMOS transistor TP2 provided on the output side of the first current mirror circuit 54 is connected to the second current mirror circuit 55.

The second current mirror circuit 55 is formed of three N-channel MOS transistors TN1, TN2 and TN3. Each of the sources of the transistors TN1 to TN3 is connected to a fourth terminal T4. The fourth terminal T4 receives a low potential power supply Vss of which potential is lower than the second reference source VRN. A drain of the first NMOS transistor TN1 provided on the input side of the second current mirror circuit 55 is connected to a drain of the second transistor TP2. Drains of the second NMOS transistor TN2 and third NMOS transistor TN3 each provided on the output side of the second current mirror circuit 55, are connected to the nodes N22 and N23 of the third voltage dividing circuit 52, respectively.

Substantially the same current flows in the second PMOS transistor TP2 and the first PMOS transistor TP1, and also substantially the same current flows in the second and third NMOS transistors TN2, TN3 and the first NMOS transistor TN1. Therefore, currents I11 and I12 which are substantially the same as the output current of the operational amplifier 53, flow in the fourth terminal T4 from the nodes N22 and N23 through the second and third NMOS transistors TN2, TN3.

The operational amplifier 53 outputs a current from its output terminal so that the same voltage is applied to the input terminals thereof. The voltage difference between the input terminals of the operational amplifier 53 (i.e., the potential difference between the node N21 and the node N24) is twice the voltage applied across the unit resistor Ra. The operational amplifier 53 supplies a current to the eight resistors Rc so that the potential difference becomes zero.

The output current of the operational amplifier 53 is substantially the same as the current flowing in the second PMOS transistor TP2, and the current is also substantially the same as the currents Ill, I12 flowing in the second and third NMOS transistors TN2, TN3.

If the value of the unit resistor Ra (Rb, Rc) is assumed to be "1", then the currents I11, I12 are calculated as follows:

$$I11 = I12$$
$$= (VRP - VRN) \times (2/32)/8$$
$$= (VRP - VRN) \times (1/128)$$
$$= (VRP - VRN)/128$$

A current having a value substantially the same as that of the currents I11, I12 is referred to as a unit current. The unit current will hereinafter be denoted as I(t).

If the potential applied to the node N21 is set to the intermediate potential ((VRP−VRN)/2) between the first reference source VRP and the second reference source VRN, the number of resistors forming the second voltage dividing circuit 51 may be changed, correspondingly. Further, each of the resistors may have a resistor value different from one another.

The control current generating circuit 32 includes the transistor TN1 provided on the input side of the second current mirror circuit 55 and NMOS transistors TN21 to TN24 connected to one another in a current mirror arrangement. Each of the transistors TN21 to TN24 has the same capacity as that of the transistor TN2 provided on the output side of the second current mirror circuit 55. Therefore, the transistors TN21 to TN24 have flowing therein currents I21 to I24 substantially the same as the current I11 (i.e., the unit current I(t)) flowing in the transistor TN2.

The output current correcting circuit 35 includes the transistor TN1 of the second current mirror circuit 55 and an NMOS transistor TN31 connected in a current mirror fashion. The transistor TN31 has four times the capacity of the transistor TN2 provided on the output side of the second current mirror circuit 55. Therefore, the transistor TN31 has a current I31 having a magnitude four times the unit current I(t) flowing therein.

The second current correcting circuit 37 includes an NMOS transistor TN41 connected to the transistor TN1 of the second current mirror circuit 55 in a current mirror connection manner. The transistor TN41 has substantially the same capacity as that of the transistor TN2 of the second current mirror circuit 55. Therefore, the transistor has a current I41 have substantially the same magnitude as that of the unit current I(t) flowing therein.

Figure 7:
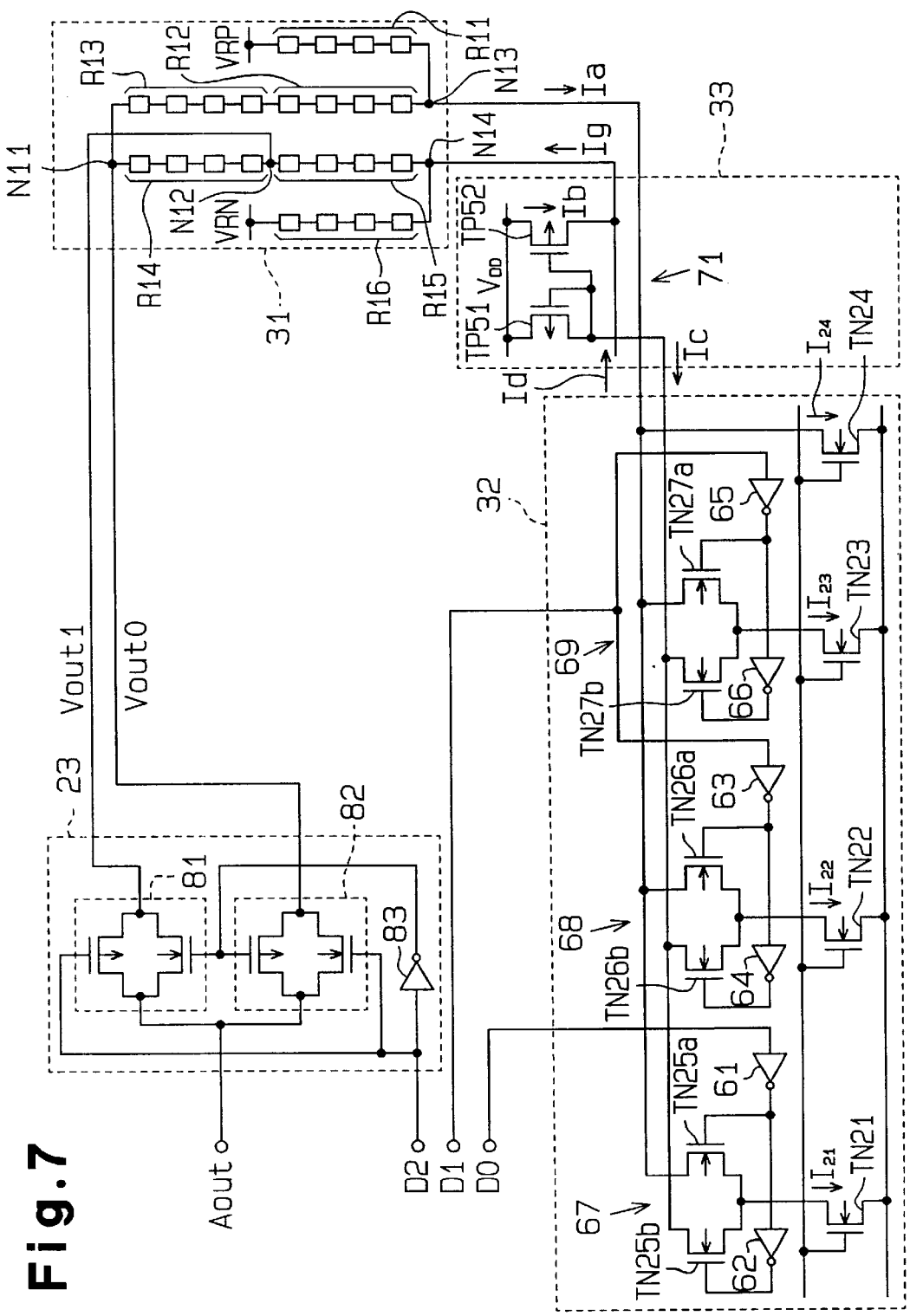
FIG. 7 is a circuit diagram of an output voltage selecting circuit of the D/A converter of FIG. 2 and a control current generating circuit and a control current inverting circuit of the voltage generating circuit of FIG. 3.

Now, the configuration and operation of the control current generating circuit 32 and the control current inverting circuit 33 will be described with reference to FIG. 7.

The control current generating circuit 32 includes the transistors TN21 to TN24, inverters 61 to 66, and switch circuits 67 to 69. Each source of the transistors TN21 to TN24 is connected to the fourth terminal T4 (see FIG. 5) and each drain of the transistors TN21 to TN24 is connected to the switch circuits 67 to 69. The low potential power supply VSS is applied to the fourth terminal T4.

The switch circuits 67 to 69 include transistor pairs TN25a and TN25b, TN26a and TN26b, TN27a and TN27b, respectively. Sources of the first transistor pair TN25a and TN25b are connected to each other, and the node thereof is connected to the drain of the first transistor TN21. Sources of the second transistor pair TN26a and TN26b are connected to each other, and the node thereof is connected to the drain of the second transistor TN22. Sources of the third transistor pair TN27a and TN27b are connected to each other, and the node thereof is connected to the drain of the third transistor TN23.

The first inverter 61 is supplied at its input terminal with the digital signal D0, and connected at its output terminal to a gate of the transistor TN25a and an input terminal of the second inverter 62. An output terminal of the second inverter 62 is connected to a gate of the transistor TN25b. The third inverter 63 is supplied at its input terminal with the digital signal D1, and is connected at its output terminal to a gate of the transistor TN26a and an input terminal of the fourth inverter 64. An output terminal of the fourth inverter 64 is connected to a gate of the transistor TN26b. The fifth inverter 65 is supplied at its input terminal with the digital signal D1, and is connected at its output terminal to a gate of the transistor TN27a and an input terminal of the sixth inverter 66. An output terminal of the sixth inverter 66 is connected to a gate of the transistor TN27b.

The transistors TN21 to TN24 are connected to the transistor TN3 of the constant-current circuit 34 in a current mirror fashion, and generate the currents I21 to I24, respectively.

The inverter 61 drives the transistor TN25a and the inverter 62 in response to the digital signal D0. The inverter 62 drives the transistor TN25b in response to a signal from the inverter 61. Thus, a pair of transistors TN25a and TN25b is turned on or off complementarily in response to the digital signal D0.

The inverter 63 drives the transistor TN26a and the inverter 64 in response to the digital signal D1. The inverter 64 drives the transistor TN26b in response to a signal from the inverter 63. Thus, the transistor pair TN26a and TN26b is turned on or off complementarily in response to the digital signal D1.

The inverter 65 drives the transistor TN27a and the inverter 66 in response to the digital signal D1. The inverter 66 drives the transistor TN27b in response to a signal from the inverter 65. Thus, the transistor pair TN27a and TN27b is turned on or off complementarily in response to the digital signal D1.

In this way, the control current generating circuit 32 generates the control current Ia and the current Ic which are related with the control current Ia in accordance with the combination of the transistors which are turned on in response to the digital signal D1, D0. The transistors TN21 to TN24 of the control current generating circuit 32 may be weighted in accordance with the bit position of the digital signal D1, D0.

[Case in which the digital signal D1 and D0 take the L-level]

The transistors TN25a, TN26a, TN27a are turned on in response to the digital signal D1, D0. Thus, the control current Ia having a magnitude corresponding to the sum of the currents I21 to I24 (i.e., four times the unit current I(t)) flowing in the first to fourth transistors TN21 to TN24 is generated. At this time, the value of the current Ic is zero.

[Case in which the digital signal D0 takes the H-level while the digital signal D1 takes the L-level]

The transistor TN25b is turned on in response to the digital signal D0 and the transistor pair TN26a and TN27a is turned on in response to the digital signal D1. Thus, there are supplied the control current Ic having a value substantially the same as that of the current I21 (i.e., the unit current I(t)) flowing in the first transistor TN21 and the control current Ia having a value corresponding to the sum of the currents I22 to I24 (i.e., three times the unit current I(t)) flowing in the second to fourth transistors TN22 to TN24.

[Case in which the digital signal D0 takes the L-level while the digital signal D1 takes the H-level]

The transistor TN25a is turned on in response to the digital signal D0 and the transistors TN26b and TN27b are turned on in response to the digital signal D1. Thus, the control current Ia having a value corresponding to the sum of the currents I21 and I24 (i.e., twice the unit current I(t)) flowing in the first and fourth transistors TN21 and TN24, respectively, and the control current Ic having a value corresponding to the sum of the currents I22 and I23 (i.e., twice the unit current I(t)) flowing in the second and third transistors TN22 and TN23, respectively, are provided.

[Case in which the digital signal D1 and D0 take the H-level]

The transistors TN25b, TN26b, TN27b are turned on in response to the digital signal D1, D0. Thus, the control current Ic having a value corresponding to the sum of the currents I21 to I23 (i.e., three times the unit current I(t))

flowing in the first to third transistors TN21 to TN23 and the control current Ia having a value substantially the same as that of the current I24 flowing in the fourth transistor TN24 are supplied.

In summary, the control current generating circuit 32 generates the control current Ia and the control current Ic in the following manner in response to the digital signal D1 and D0:

When the digital signal status takes a value "0" in a representation of a decimal number, $Ia=4\times I(t)$ and $Ic=0\times I(t)$.

When the digital signal status takes a value "1" in a representation of a decimal number, $Ia=3\times I(t)$ and $Ic=1\times I(t)$.

When the digital signal status takes a value "2" in a representation of a decimal number, $Ia=2\times I(t)$ and $Ic=2\times I(t)$.

When the digital signal status takes a value "3" in a representation of a decimal number, $Ia=1\times I(t)$ and $Ic=3\times I(t)$.

The control current inverting circuit 33 includes a current mirror circuit 71 formed of PMOS transistors TP51, TP52. A drain of the transistor TP51 provided on the input side of the current mirror circuit 71 is connected to sources of the transistors TN25b, TN26b, TN27b, and the control current Ic is flown in the transistor TP51. The second transistor TP52 provided on the output side is connected at its drain to the node N14 of the first voltage dividing circuit 31. The second transistor TP52 has a capacity substantially the same as that of the first transistor TP51, and supplies the control current Ib substantially the same as the current Ic flowing in the transistor TP51, to the node N14.

Figure 6:
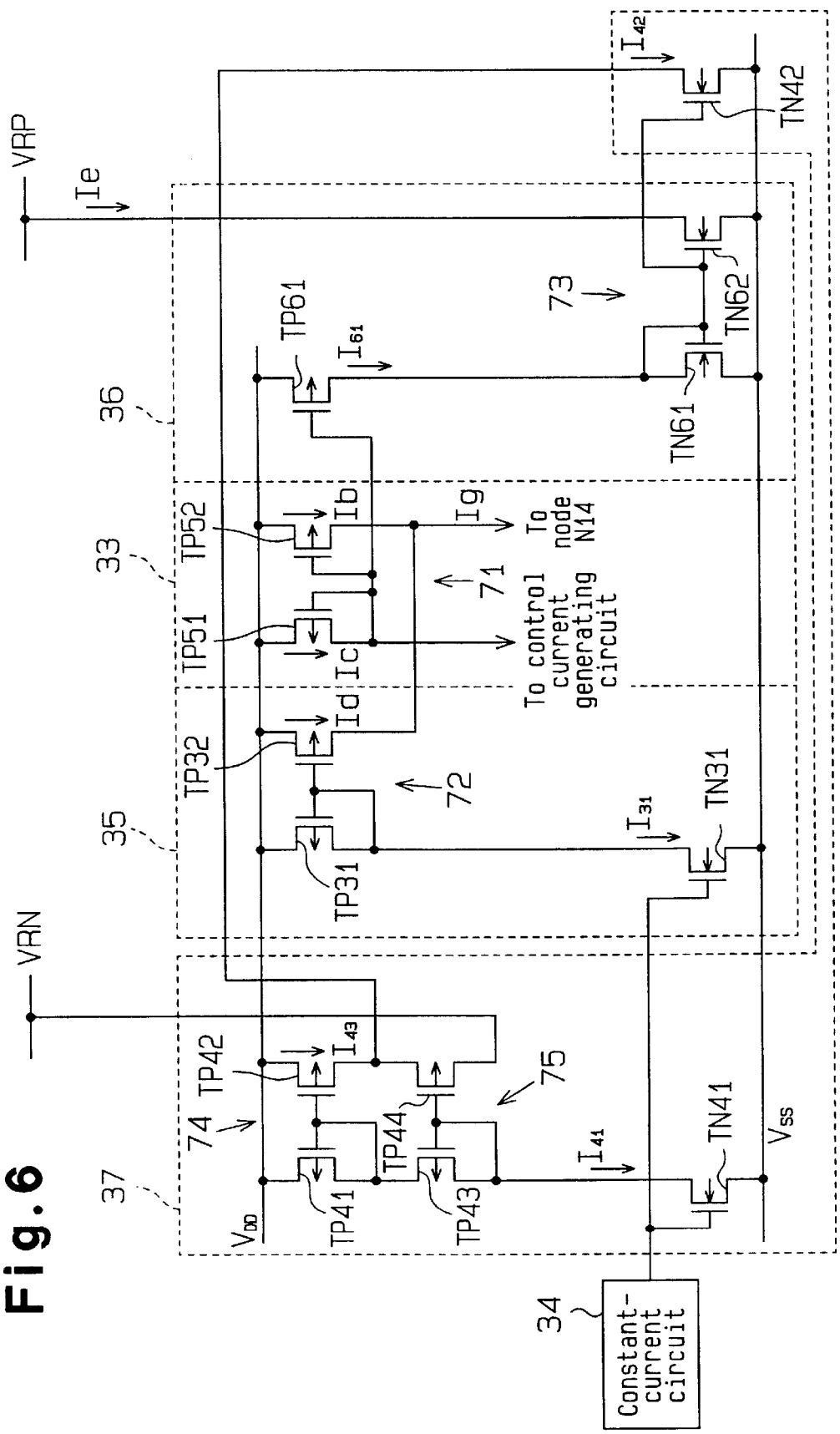
FIG. 6 is a circuit diagram of first and second current correcting circuits and a voltage correcting circuit of the voltage generating circuit of FIG. 3.

The node N14 in the first voltage dividing circuit 31 is connected to the output voltage correcting circuit 35 shown in FIG. 6. A set current Id having a magnitude about four times that of the unit current I(t) is supplied from the output voltage correcting circuit 35 to the node N14. That is, the first voltage dividing circuit 31 is supplied at the node N14 with a synthesized current Ig which derives from synthesizing the control current Ib from the control current inverting circuit 33 and the set current Id from the output voltage correcting circuit 35.

The control current Ib (Ic) has a value corresponding to the decimal number represented by the digital signal D1 and D0. The set current Id is always kept constant. Thus, the control current Ig supplied to the node N14 will change as follows in response to the status of the digital signal D1 and D0.

When the digital signal status takes a value "0" in a representation of a decimal number, $Ig=4\times I(t)$.

When the digital signal status takes a value "1" in a representation of a decimal number, $Ig=5\times I(t)$.

When the digital signal status takes a value "2" in a representation of a decimal number, $Ig=6\times I(t)$.

When the digital signal status takes a value "3" in a representation of a decimal number, $Ig=7\times I(t)$.

The configuration and operation of the output voltage correcting circuit 35, the first current correcting circuit 36 and the second current correcting circuit 37 will hereinafter be described with reference to FIG. 6.

The output voltage correcting circuit 35 includes an NMOS transistor TN31 and PMOS transistors TP31, TP32.

The transistor TN31 is connected to the transistor TN1 (see FIG. 5) of the constant-current circuit 34 in a current mirror fashion. The transistor TN31 has a current I31 having a magnitude four times that of the unit current I(t).

The transistors TP31 and TP32 form a current mirror circuit 72. The transistors TP31 and TP32 are applied at the source thereof with the high potential power supply VDD. A drain of the transistor TP31 provided on the input side is connected to a drain of the transistor TN31, and the transistor TP31 is supplied with the output current I31 of the transistor TN31. The transistor TP32 provided on the output side has a capacity substantially the same as that of the transistor TP31, and generates the set current Id having substantially the same magnitude as that of the current I31 (four times the unit current I(t)) flowing in the transistor TP31.

The first current correcting circuit 36 includes a PMOS transistor TP61 and NMOS transistors TN61, TN62. The transistor TP61 is applied at the source with the high potential power supply VDD, and connected at the drain to the NMOS transistor TN61. The transistor TP61 is connected to the transistor TP51 provided on the input side of the current mirror circuit 71 in a current mirror fashion, and generates a current I61 substantially the same as the current Ic flowing in the transistor TP51.

The NMOS transistors TN61 and TN62 form a current mirror circuit 73. The transistors TN61 and TN62 receive at their sources the low potential power supply VSS. The transistor TN61 provided on the input side is connected to a drain of the NMOS transistor TP61. The transistor TN62 provided on the output side is connected at the drain to the first terminal T1 (see FIG. 3).

The transistor TN62 has substantially the same capacity as that of the transistor TN61. Therefore, a first correcting current Ie substantially the same as a current I61 flowing in the transistor TN61 flows from the first reference source VRP (the first terminal T1) to the low potential power supply Vss through the transistor TN62.

The current I61 flowing in the transistor TN61 is substantially the same as the control current Ib supplied from the control current inverting circuit 33 to the node N14 of the first voltage dividing circuit 31. Therefore, the correcting current Ie, which flows from the first reference source VRP to the low potential power supply VSS through the first current correcting circuit 36, is the same as the control current Ib. The correcting current Ie can be changed as follows in accordance with the decimal representation of the digital signal D1, D0.

When the digital signal status takes a value "0" in a representation of a decimal number, $Ie=0\times I(t)$.

When the digital signal status takes a value "1" in a representation of a decimal number, $Ie=1\times I(t)$.

When the digital signal status takes a value "2" in a representation of a decimal number, $Ie=2\times I(t)$.

When the digital signal status takes a value "3" in a representation of a decimal number, $Ie=3\times I(t)$.

The second current correcting circuit 37 includes NMOS transistors TN41, TN42 and PMOS transistors TP41 to TP44.

The NMOS transistor TN41 is connected to the transistor TN31 of the constant-current circuit 34 in a current mirror fashion. A current I41 substantially the same as the unit current I(t) flows in the transistor TN41.

The NMOS transistor TN42 is connected to the transistor TN61 of the first current correcting circuit 36 in a current mirror fashion. A current I42 substantially the same as the correcting current Ie (i.e., control current Ib) flows in the transistor TN42.

The PMOS transistors TP41 and TP42 form a current mirror circuit 74. Each of the transistors TP41 and TP42 receives the high potential power supply VDD at their source, and connected at the drain thereof to each source of the transistor TP43, TP44 of a current mirror circuit 75. A drain of the transistor TP42 is connected to a drain of the transistor TN42. A drain of the transistor TP43 is connected to a drain of the transistor TN41, and a drain of the transistor TP44 is connected to the second terminal T2 (see FIG. 3).

The transistor TP42 provided on the output side of the current mirror circuit 74 has a capacity three times that of the transistor TP41 provided on the input side of the current mirror circuit 74. Therefore, the transistor TP41 receives the current I41 flowing in the transistor TN41, and the transistor TP42 has a current I43 three times the current I41 (three times the unit current I(t)).

The second current mirror circuit 75 is connected to the first current mirror circuit 74 in a cascade fashion.

The transistor TP44 provided on the output side of the current mirror circuit 75 has a capacity three times that of the transistor TP43 provided on the input side of the current mirror circuit 75. An output current from the transistor TP41 is supplied directly through the transistor TP43 to the transistor TN41. The transistor TP44 supplies to the second reference source VRN the second correcting current If which derives from synthesizing the output current I42 of the transistor TN42 and the output current I43 of the transistor TP42 together.

The transistor TP42 has the constant current I43. Thus, the correcting current If flowing in the transistor TP44 is given as follows:

$$If = I43 - I42$$

Therefore, the correcting current If can be changed as follows in accordance with the decimal representation of the digital signal D1, D0.

When the digital signal status takes a value "0" in a representation of a decimal number, $If = 3 \times I(t)$.

When the digital signal status takes a value "1" in a representation of a decimal number, $If = 2 \times I(t)$.

When the digital signal status takes a value "2" in a representation of a decimal number, $If = 1 \times I(t)$.

When the digital signal status takes a value "3" in a representation of a decimal number, $If = 0 \times I(t)$.

The configuration and operation of the selecting circuit 23 will hereinafter be described with reference to FIG. 7.

The selecting circuit 23 includes first and second switch circuits 81 and 82, and an inverter 83. The first switch circuit 81 is connected to the node N12 of the first voltage dividing circuit 31 and the second switch circuit 82 is connected to the node N11.

Each of the first and second switch circuits 81, 82 includes a transistor circuit pair in which a PMOS transistor and an NMOS transistor are connected to each other in parallel. The NMOS transistor of the first switch circuit 81 and the PMOS transistor of the second switch circuit 82 are supplied at the gates with the digital signal D2, while the PMOS transistor of the first switch circuit 81 and the NMOS transistor of the second switch circuit 82 are supplied at the gates with a digital signal deriving from inverting the digital signal D2, by way of the inverter 83. The first and second switch circuits 81, 82 are complementarily turned on or off in response to the digital signal D2. If one of the switch circuits 81 or 82 is turned on, one of the output signals Vout0 and Vout1 is generated as the analog signal Aout through the turned-on switch circuit.

Next, the operation of the D/A converter 21 will be described.

[Case in which a decimal number "0" is represented (D0=Low, D1=Low, 02=Low)]

The first voltage dividing circuit 31 is supplied with the control current Ia having a magnitude four times that of the unit current I(t) and the control current Ig having a magnitude four times that of the unit current I(t). Thus, the node N13 of the first voltage dividing circuit 31 is set to have a voltage substantially the same as that of the node voltage between the eighth resistor and the ninth resistor counted from the first reference source VRP in the second voltage dividing circuit 51. Further, the node N14 of the first voltage dividing circuit 31 is set to have a voltage substantially the same as that of the node voltage between the twenty-fourth resistor and the twenty-fifth resistor counted from the first reference source VRP in the second voltage dividing circuit 51.

Thus, the node voltages at seventeen points between resistor elements including the node N13 and the node N14 of the first voltage dividing circuit 31 substantially coincide with the node voltages at seventeen points between the resistors provided between the two nodes, i.e., the node interposed between the eighth and ninth resistors counted from the first reference source VRP of the second voltage dividing circuit 51 and the node interposed between the twenty-fourth resistor and the twenty-fifth resistor counted from the first reference source VRP.

The switch circuit 82 is turned on in response to the digital signal D2 having a status of L-level, and the output signal Vout0 (i.e., the potential of the node N11) is output as the analog signal Aout. The potential of the node N11 is substantially equal to the node potential between the twentieth and twenty-first resistors counted from the first reference source VRP of the second voltage dividing circuit 51. That is, the voltage of the analog signal Aout is calculated as follows:

$$Aout = (VRP - VRN) \times (12/32) + VRN$$

[Case in which a decimal number "1" is represented (D0=High, D1=Low, D2=Low)]

The first voltage dividing circuit 31 is supplied with the control current Ia having a magnitude four times that of the unit current I(t) and the control current Ig having a magnitude four times that of the unit current I(t). Thus, the node N13 of the first voltage dividing circuit 31 is set to have a voltage substantially the same as that of the node voltage between the seventh resistor and the eighth resistor counted from the first reference source VRP in the second voltage dividing circuit 51. The node N14 of the first voltage dividing circuit 31 is set to have a voltage substantially the same as that of the node voltage between the twenty-third resistor and the twenty-fourth resistor counted from the first reference source VRP in the second voltage dividing circuit 51.

Thus, the node voltages at the seventeen points between resistor elements including the node N13 and the node N14 of the first voltage dividing circuit 31 substantially coincide with the node voltages at the seventeen points between the resistors provided between the two nodes, i.e., the node interposed between the seventh and eighth resistors counted from the first reference source VRP of the second voltage dividing circuit 51 and the node interposed between the twenty-third resistor and the twenty-fourth resistor counted from the first reference source VRP.

The switch circuit 82 is turned on in response to the digital signal D2 having a status of L-level, and the output signal Vout0 (i.e., the potential of the node N11) is output as the analog signal Aout. The potential of the node N11 is substantially equal to the node potential between the nineteenth and twentieth resistors counted from the first reference source VRP of the second voltage dividing circuit 51. That is, the voltage of the analog signal Aout is calculated as follows:

$$Aout = (VRP - VRN) \times (13/32) + VRN$$

[Case in which a decimal number "2" is represented (D0=Low, D1=High, D2=Low)]

The first voltage dividing circuit 31 is supplied with the control current Ia having a magnitude four times that of the unit current I(t) and the control current Ig having a magnitude four times that of the unit current I(t). Thus, the node N13 of the first voltage dividing circuit 31 is set to have a voltage substantially the same as that of the node voltage between the sixth resistor and the seventh resistor counted from the first reference source VRP in the second voltage dividing circuit 51. The node N14 of the first voltage dividing circuit 31 is set to have a voltage substantially the same as that of the node voltage between the twenty-second resistor and the twenty-third resistor counted from the first reference source VRP in the second voltage dividing circuit 51.

Thus, the node voltages at the seventeen points between resistor elements including the node N13 and the node N14 of the first voltage dividing circuit 31 substantially coincide with the node voltages at the 17 points between the resistors provided between the two nodes, i.e., the node interposed between the sixth and seventh resistors counted from the first reference source VRP of the second voltage dividing circuit 51 and the node interposed between the twenty-second resistor and the twenty-third resistor counted from the first reference source VRP.

The switch circuit 82 is turned on in response to the digital signal D2 having a status of L-level, and the output signal Vout0 (i.e., the potential of the node N11) is output as the analog signal Aout. The potential of the node N11 is substantially equal to the node potential between the eighteenth and the nineteenth resistors counted from the first reference source VRP of the second voltage dividing circuit 51. That is, the voltage value of the analog signal Aout is calculated as follows:

Aout=(VRP−VRN)×(14/32)+VRN

[Case in which a decimal number "3" is represented (D0=High, D1=High, D2=Low)]

The first voltage dividing circuit 31 is supplied with the control current Ia equal to the unit current I(t) and the control current Ig having a magnitude seven times that of the unit current I(t). Thus, the node N13 of the first voltage dividing circuit 31 is set to have a voltage substantially the same as that of the node voltage between the fifth resistor and sixth resistor counted from the first reference source VRP in the second voltage dividing circuit 51. The node N14 of the first voltage dividing circuit 31 comes to have a voltage substantially coincident with that of the node voltage between the twentieth resistor and the twenty-first resistor counted from the first reference source VRP in the second voltage dividing circuit 51.

Thus, the node voltages at the 17 points between resistor elements including the node N13 and the node N14 of the first voltage dividing circuit 31 substantially coincide with the node voltages at the 17 points between the resistors provided between the two nodes, i.e., the node interposed between the fifth and sixth resistors counted from the first reference source VRP of the second voltage dividing circuit 51 and the node interposed between the twentieth resistor and the twenty-first resistor counted from the first reference source VRP.

The switch circuit 82 is turned on in response to the digital signal D2 having a status of L-level, and the output signal Vout0 (i.e., the potential of the node N11) is output as the analog signal Aout. The potential of the node N11 is substantially equal to the node potential between the seventeenth and eighteenth resistors counted from the first reference source VRP of the second voltage dividing circuit 51. That is, the voltage value of the analog signal Aout is calculated as follows:

Aout=(VRP−VRN)×(15/32)+VRN

[Case in which a decimal number "4" is represented (D0=Low, D1=Low, D2=High)]

In this case, potentials are set in a manner similar to that of the case in which a decimal number "0" is represented. The switch circuit 81 is turned on in response to the digital signal D2 having a status of H-level, and the output signal Vout1 (i.e., the potential of the node N12) is output as the analog signal Aout. The potential of the node N12 is substantially equal to the node potential between the sixteenth and seventeenth resistors counted from the first reference source VRP of the second voltage dividing circuit 51. That is, the voltage of the analog signal Aout is calculated as follows:

Aout=(VRP−VRN)×(16/32)+VRN

[Case in which a decimal number "5" is represented (D0=High, D1=Low, D2=High)]

In this case, potentials are set in a manner similar to that of the case in which a decimal number "1" is represented. The switch circuit 81 is turned on in response to the digital signal D2 having the status of H-level, and the output signal Vout1, i.e., the potential of the node N12 (potential at the node between the fifteenth and sixteenth resistors counted from the first reference source VRP of the second voltage dividing circuit 51), is output as the analog signal Aout. The voltage value of the analog signal Aout is calculated as follows:

Aout=(VRP−VRN)×(17/32)+VRN

[Case in which a decimal number "6" is represented (D0=Low, D1=High, D2=High)]

In this case, potentials are set in a manner similar to that of the case in which a decimal number "2" is represented. The switch circuit 81 is turned on in response to the digital signal D2 having the status of H-level, and the output signal Vout1 (i.e., the potential of the node N12) is output as the analog signal Aout. The potential of the node N12 is substantially equal to the node potential between the fourteenth and fifteenth resistors counted from the first reference source VRP of the second voltage dividing circuit 51. That is, the voltage value of the analog signal Aout is calculated as follows:

Aout=(VRP−VRN)×(18/32)+VRN

[ Case in which a decimal number "7" is represented (D0=High, D1=High, D2=High)]

In this case, potentials are set in a manner similar to that of the case in which a decimal number "3" is represented. The switch circuit 81 is turned on in response to the digital signal D2 having the status of H-level, and the output signal Vout1 (i.e., the potential of the node N12) is output as the analog signal Aout. The potential of the node N12 is substantially equal to the node potential between the thirteenth and fourteenth resistors counted from the first reference source VRP of the second voltage dividing circuit 51. That is, the voltage value of the analog signal Aout is calculated as follows:

Aout=(VRP−VRN)×(19/32)+VRN

The operation of the first current correcting circuit 36 in response to the first reference source VRP applied to the first terminal T1 will hereinafter be described.

The amount of current flowing from the first terminal T1 to the first voltage dividing circuit 31 will fluctuate depending on the control current Ia. In order to compensate for the fluctuation, the first current correcting circuit 36 generates the correcting current Ie flowing in the first terminal T1.

[Case in which a decimal number "0" or "4" is represented (D0=Low, D1=Low)]

In this case, the control current Ia four times the unit current I(t) is drawn from the node N13. Thus, the first current correcting circuit 36 generates the correcting current Ie zero time the unit current I(t).

[Case in which a decimal number "1" or "5" is represented (D0=High, D1=Low)]

In this case, the control current Ia three times the unit current I(t) is drawn from the node N13. Thus, the first current correcting circuit 36 generates the correcting current Ie equal to the unit current I(t).

[Case in which a decimal number "2" or "6" is represented (D0=Low, D1=High)]

In this case, the control current Ia twice the unit current I(t) is drawn from the node N13. Thus, the first current correcting circuit 36 generates the correcting current Ie twice the unit current I(t).

[Case in which a decimal number "3" or "7" is represented (D0=High, D1=High)]

In this case, the control current Ia equal to the unit current I(t) is drawn from the node N13. Thus, the first current correcting circuit 36 generates the correcting current Ie three times the unit current I(t).

As described above, the first current correcting circuit 36 controls the correcting current Ie so that the sum of the absolute value of the control current Ia and the absolute value of the correcting current Ie is kept at a constant value (four times the unit current I(t)). In this way, the potential at the first terminal T1 is prevented from fluctuating, and conversion from the digital signals to the analog signal is carried out precisely, so that accurate output signals Vout0, Vout1 (i.e., the analog signal Aout) are provided.

The operation of the second current correcting circuit 37 in response to the second reference source VRN applied to the second terminal T2 will hereinafter be described.

The amount of current flowing from the first voltage dividing circuit 31 to the second terminal T2 will fluctuate depending on the control current Ig (current deriving from synthesizing the control current Ib and the set current Id). In order to compensate for the fluctuation, the correcting current If is supplied from the second current correcting circuit 37 to the second terminal T2.

[Case in which a decimal number "0" or "4" is represented (D0=Low, D1=lLow)]

In this case, the control current Ig four times the unit current I(t) is supplied to the node N14. Thus, the second current correcting circuit 37 supplies the correcting current If three times the unit current I(t).

[Case in which a decimal number "1" or "5" is represented (D0=High, D1=Low)]

In this case, the control current Ig five times the unit current I(t) is supplied to the node N14. Thus, the second current correcting circuit 37 supplies the correcting current Ie twice the unit current I(t).

[Case in which a decimal number "2" or "6" is represented (D0=Low, D1=High)]

In this case, the control current Ig six times the unit current I(t) is supplied to the node N14. Thus, the second current correcting circuit 37 supplies the correcting current If equal to the unit current I(t).

[Case in which a decimal number "3" or "7" is represented (D0=High, D1=high)]

In this case, the control current Ig seven times the unit current I(t) is supplied to the node N14. Thus, the second current correcting circuit 37 supplies the correcting current If zero time the unit current I(t).

As described above, the second current correcting circuit 37 controls the correcting current If so that the sum of the absolute value of the control current Ig and the absolute value of the correcting current If is kept at a constant value (seven times the unit current I(t)). In this way, the potential at the second terminal T2 is prevented from fluctuating, and conversion from the digital signals to the analog signal is carried out precisely, so that accurate output signals Vout0, Vout1 (i.e., the analog signal Aout) are obtained.

As described above, according to the present embodiment, the following effects are obtained.

(1) There is provided the voltage generating circuit 22 including the first resistor R11 connected to the first terminal T1 supplied with the first reference source VRP, the sixth resistor R16 connected to the second terminal T2 supplied with the second reference source VRN and having an impedance substantially the same as that of the first reference resistor R11, and the second to fifth resistors R12 to R15 connected in series between the resistors R11 and R16. The first control current Ia is drawn from the node N13 provided between the first resistor R11 and the second resistor R12. The second control current Ib having an interrelation with the first control current Ia is supplied to the node N14 provided between the fifth resistor R15 and the sixth resistor R16. The first and second control currents Ia, Ib are controlled in such a manner that the potential difference between the nodes N13 and N14 is maintained constant while each potential of the nodes N13 and N14 is changed to generate the first and second output signals Vout0, Vout1 from the nodes N11 and nl2 provided at both ends of the fourth resistor R14. In this manner, voltages of the first and second output signals Vout0, Vout1 are changed by controlling the control currents Ia, Ib. As a result, the first to sixth resistors R11 to P16 are free from connection to a switch circuit or wiring, so that the voltage generating circuit 22 is free from influence of the these resistors, and precision of voltage of the first and second output signals Vout0, Vout1 is improved. Thus, the D/A converter 21 generates the analog signal Aout at a high precision.

(2) The first current correcting circuit 36 (a high potential terminal current correcting circuit) draws thereto the first correcting current Ie substantially the same as the second control current Ib from the first terminal T1. The second current correcting circuit 37 (a low potential terminal current correcting circuit) supplies to the second terminal T2, the second correcting current If substantially the same as the first control current Ia. In this way, the potentials of the first and second reference sources VRP, VRN can be prevented from fluctuating by the first and second control currents Ia, Ib, so that the first and second output signals Vout0, Vout1 are generated with high precision.

(3) The output voltage correcting circuit 35 supplies the predetermined set current Id to the node N14. Thus, the effective impedance of the resistor R16 between the node N14 and the second terminal T2 is changed, so that it becomes easy to make an initial setting on the divided voltage applied across the first terminal T1 and the second terminal T2 at a predetermined voltage step.

It should be apparent to those skilled in the art that the present invention may be embodied in many other specific forms without departing from the spirit or scope of the invention. Therefore, the present examples and embodiment are to be considered as illustrative and not restrictive and the invention is not to be limited to the details given herein, but may be modified within the scope and equivalence of the appended claims.

What is claimed is:

1. A voltage generating circuit comprising:
   a first voltage dividing circuit for dividing a voltage between a first reference power supply and a second reference power supply and generating an output signal having a divided voltage, the first voltage dividing circuit including,
   a first impedance element connected to a first terminal to which the first reference power supply is provided,
   a second impedance element having an impedance substantially the same as that of the first impedance element and connected to a second terminal to which the second reference power supply is provided, and
   a third impedance element connected between the first impedance element and the second impedance element and having a predetermined impedance;
   a first current source connected to a first node provided between the first impedance element and the third impedance element; and
   a second current source connected to a second node provided between the second impedance element and the third impedance element,
   wherein the first current source and the second current source supply a first control current and a second control current, which are related to each other, to the first node and the second node, respectively, and change the potentials of the first node and the second node to potentials corresponding to the first control current and the second control current, respectively, while the potential difference between the first node and the second node is maintained constant.

2. The voltage generating circuit according to claim 1, wherein the first reference power supply is a high potential power supply and the second reference power supply is a low potential power supply.

3. The voltage generating circuit according to claim 1, wherein first control current and the second control current flow in opposite directions.

4. The voltage generating circuit according to claim 1, wherein the first current source and the second current source supply the first control current and the second control current so that the sum of the absolute values of the first control current and the second control current is always maintained constant.

5. The voltage generating circuit according to claim 1, wherein each of the first to third impedance elements includes a plurality of unit resistor elements each having a predetermined resistance value.

6. The voltage generating circuit according to claim 1, wherein the third impedance element comprises a plurality of sub-impedance elements connected in series, each of the sub-impedance elements having an impedance substantially the same as that of the first impedance element, and the output signal of the first voltage dividing circuit is output from a third node between a predetermined two of the plurality of sub-impedance elements.

7. The voltage generating circuit according to claim 1, further comprising a constant-current circuit connected to the first and second current sources and generating a unit current, wherein the first and second current sources change the first and second control currents, respectively, based on the unit current.

8. The voltage generating circuit according to claim 7, wherein the unit current is set to correspond to a voltage variable step of the output signal of the first voltage dividing circuit.

9. The voltage generating circuit according to claim 7, wherein the constant-current circuit includes:
   a second voltage dividing circuit for dividing the voltage between the first reference power supply and the second reference power supply and generating a first divided voltage;
   a third voltage dividing circuit for dividing the voltage between the first reference power supply and the second reference power supply and generating a second divided voltage, the third voltage dividing circuit being supplied with the voltages of the first reference power supply and the second reference power supply and including fourth and fifth impedance elements having the same impedance and a sixth impedance element connected between the fourth impedance element and the fifth impedance element;
   a differential circuit connected to the second and third voltage dividing circuit, for receiving the first divided voltage and the second divided voltage and generating an output current corresponding to a voltage difference between the first divided voltage and the second divided voltage; and
   current mirror circuits connected to the third voltage dividing circuit and the differential circuit, for receiving the output current from the differential circuit and generating the unit current having a magnitude substantially the same as that of the output current from a forth node between the forth impedance element and the fifth impedance element and a fifth node between the fifth impedance element and the sixth impedance element.

10. The voltage generating circuit according to claim 1, wherein the first current source includes a control current generating circuit for generating the first control current changing at every unit current step in response to a digital signal and generating a third control current related to the first control current, and
    the second current source includes a control current inverting circuit for receiving the third control current from the control current generating circuit and generating the second control current flowing in the direction opposite that of the third control current.

11. The voltage generating circuit according to claim 10, wherein the control current generating circuit has a plurality of transistors, the number of which corresponds to the number of bits of the digital signal, generates the first control current based on the current flowing in the transistors corresponding to the bit number of the digital signal, and generates the third control current based on a current flowing in the remaining transistors.

12. The voltage generating circuit according to claim 11, wherein one of the plurality of transistors is always utilized for generating the first control current.

13. The voltage generating circuit according to claim 10, wherein the control current inverting circuit includes a current mirror circuit for receiving the third control current from the control current generating circuit and generating the second control current flowing in the direction opposite that of the third control current.

14. The voltage generating circuit according to claim 1, further comprising a voltage correcting circuit connected to at least one of the first and second nodes, and supplying a predetermined set current to at least one of the first and second nodes.

15. The voltage generating circuit according to claim 14, wherein the voltage correcting circuit corrects an effective impedance between at least one of the first and second nodes and the corresponding reference power supply.

16. The voltage generating circuit according to claim 1, further comprising a first current correcting circuit connected to the first terminal for drawing from the first terminal a first correcting current having a magnitude substantially the same as that of the second control current.

17. The voltage generating circuit according to claim 16, further comprising a second current correcting circuit connected to the second terminal for supplying to the second terminal a second correcting current having a magnitude substantially the same as that of the first control current.

18. A voltage generating circuit comprising:
 a first voltage dividing circuit for dividing a voltage between a first reference power supply and a second reference power supply and generating an output signal having a divided voltage, the first voltage dividing circuit including,
  a first impedance element connected to a first terminal to which a voltage of the first reference power supply is supplied,
  a second impedance element having an impedance substantially the same as that of the first impedance element and connected to a second terminal to which a voltage of the second reference power supply is supplied, and
  a third impedance element connected between the first impedance element and the second impedance element and having a predetermined impedance;
 a first current source connected to a first node provided between the first impedance element and the third impedance element;
 a second current source connected to a second node provided between the second impedance element and the third impedance element, wherein the first current source and the second current source supply a first control current and a second control current having an interrelation with each other, to the first node and the second node, respectively, and change the potentials of the first node and the second node to potentials corresponding to the first control current and the second control current, respectively, while the potential difference between the first node and the second node is maintained substantially constant;
 a constant-current circuit connected to the first and second current sources for generating a unit current, the first and second current sources changing the first and second control currents, respectively, based on the unit current;
 a voltage correcting circuit connected to at least one of the first and second nodes, for supplying a predetermined set current to at least one of the first and second nodes;
 a first current correcting circuit connected to the first terminal for receiving from the first terminal a first correcting current having a magnitude substantially the same as that of the second control current; and
 a second current correcting circuit connected to the second terminal for supplying to the second terminal a second correcting current having a magnitude substantially the same as that of the first control current.

19. A D/A converter for converting a digital signal containing an upper bit and lower bits to an analog signal, comprising:
 a voltage generating circuit for generating a plurality of output voltage signals corresponding to the number of the lower bits of the digital signal; and
 a selecting circuit connected to the voltage generating circuit for selecting one of the plurality of output voltage signals in accordance with the upper bit of the digital signal, and outputting the selected output voltage signal as an analog signal,
 wherein the voltage generating circuit includes,
  a first voltage dividing circuit for dividing a voltage between a first reference power supply and a second reference power supply and generating the plurality of output voltage signals having a divided voltage, the first voltage dividing circuit including,
   a first impedance element connected to a first terminal to which a voltage of the first reference power supply is supplied,
   a second impedance element having an impedance substantially the same as that of the first impedance element and connected to a second terminal to which a voltage of the second reference power supply is provided, and
   a third impedance element connected between the first impedance element and the second impedance element and having a predetermined impedance;
  a first current source connected to a first node provided between the first impedance element and the third impedance element, and
  a second current source connected to a second node provided between the second impedance element and the third impedance element,
 wherein the first current source and the second current source supply a first control current and a second control current, which are related to each other, to the first node and the second node, respectively, and change the potentials of the first node and the second node to potentials corresponding to the first control current and the second control current, respectively, while the potential difference between the first node and the second node is maintained constant.

* * * * *